(12) United States Patent
Hastings (10) Patent No.: US 6,617,906 B1
(45) Date of Patent: Sep. 9, 2003

(54) LOW-CURRENT COMPLIANCE STACK USING NONDETERMINISTICALLY BIASED ZENER STRINGS

(75) Inventor: Roy Alan Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/261,775

(22) Filed: Oct. 1, 2002

(51) Int. Cl.[7] .................................................. H03K 5/08
(52) U.S. Cl. ...................................... 327/321; 327/309
(58) Field of Search .............................. 327/309, 315, 327/318–322, 325, 327, 328, 331

(56) References Cited

U.S. PATENT DOCUMENTS

| | | | | |
|---|---|---|---|---|
| 4,808,858 A | * | 2/1989 | Stoops | 327/322 |
| 4,900,955 A | * | 2/1990 | Kurpan | 327/306 |
| 5,812,006 A | | 9/1998 | Teggatz et al. | 327/309 |
| 6,531,908 B1 | * | 3/2003 | Goeser et al. | 327/309 |

* cited by examiner

Primary Examiner—Toan Tran
(74) Attorney, Agent, or Firm—W. Daniel Swayze, Jr.; W. James Brady; Frederick J. Telecky, Jr.

(57) ABSTRACT

Systems and methods are provided for limiting voltage to low-voltage devices employing a high-voltage supply. The systems and methods employ voltage limiting devices to bias cascode devices. The cascode devices are serially connected from a high-voltage supply to a low-voltage node. The voltage limiters are serially connected from the high-voltage supply to ground to bias the cascode devices. Current sources are connected in parallel with the voltage limiters except the one connected to ground. If the current sources are set to deliver substantially equal currents, then the order in which the cascode transistors are biased becomes nondeterministic, but the circuit continues to finction and the overall supply current is thereby minimized.

20 Claims, 5 Drawing Sheets

LOW-CURRENT COMPLIANCE STACK USING NONDETERMINISTICALLY BIASED ZENER STRINGS

TECHNICAL FIELD

The present invention relates to circuits, and more particularly to voltage clamping devices that enable the use of low-voltage devices in high-voltage circuits.

BACKGROUND OF INVENTION

In many applications, a high-voltage supply operates not only high-voltage devices, but also low-voltage devices as well. This situation is especially common in high-voltage integrated circuits. Most high-voltage integrated circuit processes offer both a wide variety of relatively compact low-voltage devices, and a smaller variety of larger high-voltage devices. The majority of a high-voltage integrated circuit consists of low-voltage circuitry. Therefore, some mechanism needs to be employed to protect the low-voltage components from excessive differential voltages. One common mechanism to protect a device against excessive voltage is a parallel-connected Zener diode (or a stack of such Zeners), popularly called a "Zener clamp".

Figure 1:
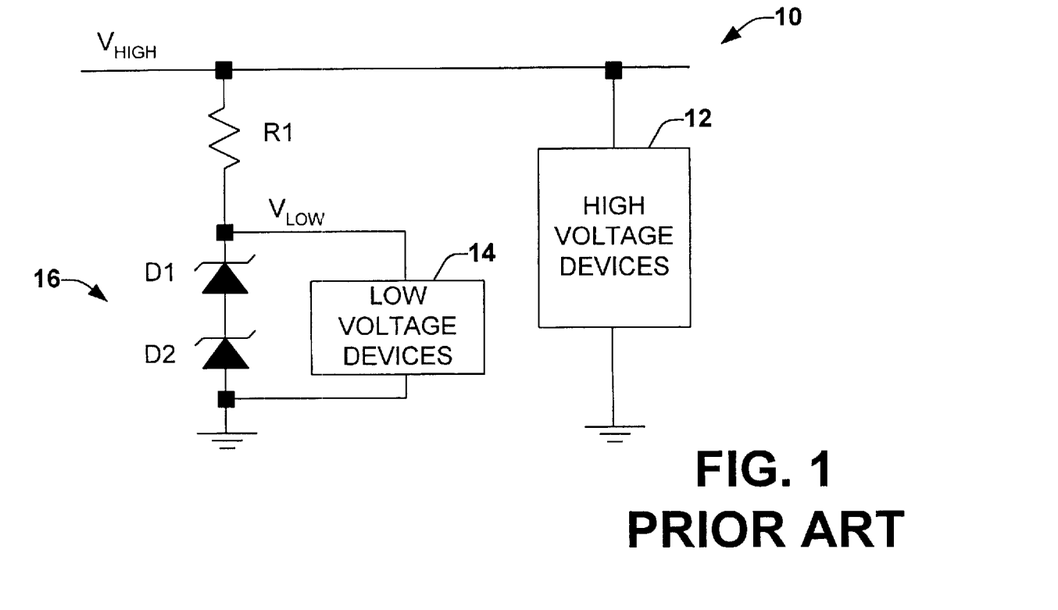
FIG. 1 illustrates a block schematic diagram of a prior art high-voltage system that employs one or more low-voltage devices.
Figure 2:
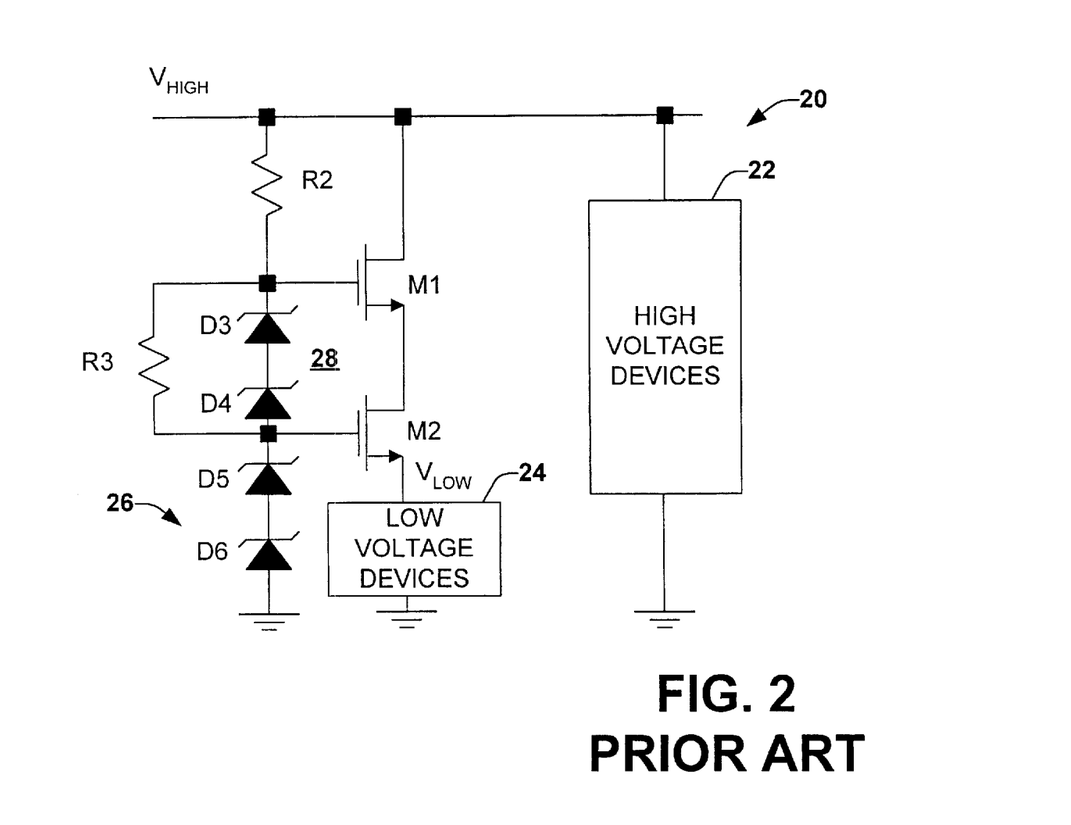
FIG. 2 illustrates a block schematic diagram of an alternate prior art high-voltage system that employs one or more low-voltage devices.

FIG. 1 illustrates a prior art high-voltage supply system 10 that employs a Zener clamp 16. A high voltage $V_{HIGH}$ (e.g., 200–400 volts) is provided to system 10 and is employed to directly power high-voltage devices 12 and to indirectly power low-voltage devices 14. A Zener clamp 16 is formed from Zener diodes D1 and D2, and is connected in parallel across the low-voltage devices 14. If the voltage across the low-voltage devices 14 exceeds the sum of the breakdown voltages of the Zener diodes D1 and D2, these diodes clamp the voltage across the low-voltage devices 14 to $V_{LOW}$. Depending upon the desired value of $V_{LOW}$, the Zener clamp 16 may contain more or fewer series-connected Zener diodes. The Zener clamp of FIG. 1 has limited application because it needs to be placed in series with some current-limiting element, such as a resistor R1. Many circuits require that the voltage across a device be clamped without restricting the current. FIG. 2 illustrates an alternate prior art high-voltage supply system 20 that achieves this end.

In FIG. 2, the high-voltage supply system 20 employs one or more low-voltage devices 24. A high voltage $V_{HIGH}$ (e.g., 200–400 volts) is provided to the system 20 and is employed to directly power high-voltage devices 22 and to indirectly power low-voltage devices 24. The low-voltage devices 24 are protected by a cascode MOSFET transistor M2. The gate of M2 is connected to a first Zener clamp 26 comprised of a Zener diode D5 and a Zener diode D6. Zener clamp 26 is biased by current flowing through resistor R2, and also through either resistor R3 or Zener diodes D3 and D4, in a manner which will be explained below. If the Zener diodes D5 and D6 have a breakdown voltage $V_Z$, then the voltage seen across the low-voltage devices 24 equals:

$$V_X = V_{IN} - V_{GS2} \text{ if } V_{IN} < 2V_Z \qquad \text{EQ. 1}$$

$$V_X = 2V_Z - V_{GS2} \text{ if } V_{IN} \geq 2V_Z \qquad \text{EQ. 2}$$

A system employing a single cascode transistor suffices for voltages that do not exceed the breakdown voltage of the cascode transistor M2. For systems that do exceed this limit, a plurality of cascodes can be coupled in series.

In FIG. 2, a second cascode transistor M1 is coupled between the high input voltage $V_{HIGH}$ and transistor M2, such that the second cascode transistor M1 limits the differential voltage seen across the first cascode transistor M2. The gate of M1 is connected to a second Zener clamp 28 comprised of Zener diodes D3 and D4. Zener clamp 28 is biased by current flowing through resistor R2. Zener clamp 28 limits the voltage $V_{DS2}$ seen across transistor M2 to $$V_{DS2} = V_{GS2}; \text{ if } V_{HIGH} < 2V_Z \qquad \text{EQ. 3}$$

$$V_{DS2} = [(R3/(R2+R3))*(V_{HIGH} - 2V_Z)] - V_{GS1} + V_{GS2}; \qquad \text{EQ. 4}$$

$$\text{if } 2V_Z \leq V_{HIGH} < 4V_Z + 2R2/R3 V_Z$$

$$V_{DS2} = 2V_Z - V_{GS1} + V_{GS2}; \text{ if } V_{HIGH} \geq 4V_Z + 2R2/R3 V_Z \qquad \text{EQ. 5}$$

Resistor R3 provides a path for current to flow around Zener diodes D3 and D4 to bias Zener diodes D5 and D6. At higher voltages, the current flowing through resistor R3 is augmented by additional current flowing through Zener diodes D3 and D4. The sum of both of these currents then flows through Zener diodes D5 and D6 to ground. Progressively higher voltages can be achieved by adding additional cascode stages. Furthermore, the number of Zener diodes in Zener clamps 26 and 28 can be decreased or increased to adjust to the needs of a specific application. Likewise, MOSFET transistors M1 and M2 can be replaced with bipolar junction transistors without significantly altering the operation of the circuit.

A stack of cascode stages such as those depicted in FIG. 2 can be termed a "compliance stack". Compliance refers to the ability of a system to adapt to externally imposed conditions. In this case, the circuit of FIG. 2 has an enhanced ability to adapt to externally applied voltages due to the presence of the cascodes, or in other words, the cascodes provide voltage compliance.

The Zener clamp of FIG. 1 does not provide voltage compliance, rather, it is the series current limiting element (R1 in this case) that provides voltage compliance. The circuit of FIG. 1 draws large amounts of current at higher voltages. The compliance stack of FIG. 2 is superior to the Zener clamp of FIG. 1 because the current drawn by the protected circuitry need not flow through the resistors, allowing very large resistances to be employed. Still, resistors R2 and R3 must draw some amount of current to overcome the effects of junction leakage, and the current they conduct increases at higher voltages. Since many modern integrated circuits are expected to operate on very small currents (<10 μA), it becomes difficult to simultaneously provide enough current at low voltages to bias the circuit, and yet to limit the current flow to acceptable levels at higher voltages. For this reason, systems of the sort illustrated in FIG. 2 are unsuited for low-current applications.

SUMMARY OF INVENTION

The following presents a simplified summary of the invention in order to provide a basic understanding of some its aspects. This summary is not an extensive overview of the invention. It is intended to neither identify key or critical elements of the invention nor to delineate the scope of the invention. Its sole purpose is to present some concepts of the invention in a simplified form as a prelude to the more detailed description that is presented later.

The present invention relates to systems and methods for limiting voltage to low-voltage devices (e.g., amplifiers, current limiters and logic) in high-voltage applications (e.g. optical switching, high-voltage drivers, dimmers, and video displays) where a high-voltage supply feeds low-voltage devices. The systems and method employ voltage limiting devices (e.g., Zener clamps) to bias one or more cascode devices (e.g., MOSFET transistors). The cascode devices are serially connected from a high-voltage supply to a low-voltage node. A primary cascode and a primary voltage limiter cooperate with a primary current source to assure that the voltage provided to the one or more low-voltage devices is within the applicable voltage limits. Additional cascodes and voltage limiters may be added to ensure that the maximum voltage rating of the primary cascode device is not exceeded.

In one aspect of the invention, the voltage limiters are series-connected Zener diodes that bias a string of series-connected cascode devices. A string of series-connected current source devices (e.g., depletion MOSFET's) provide bias for the voltage limiters. Each of the current sources is set to conduct a current, $I_{MIN}$, sufficient to bias a voltage limiter. The current drawn by the entire bias network, consisting of both the voltage limiters and their associated current sources, is substantially equal to the current drawn by one current source, or $I_{MIN}$. Manufacturing variations, as well as the magnitude of the supply voltage, will determine the exact path taken by the bias current $I_{MIN}$ from the high-voltage supply to ground, such that the biasing of the voltage limiters is nondeterministic.

These aspects are indicative of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

Figure 3:
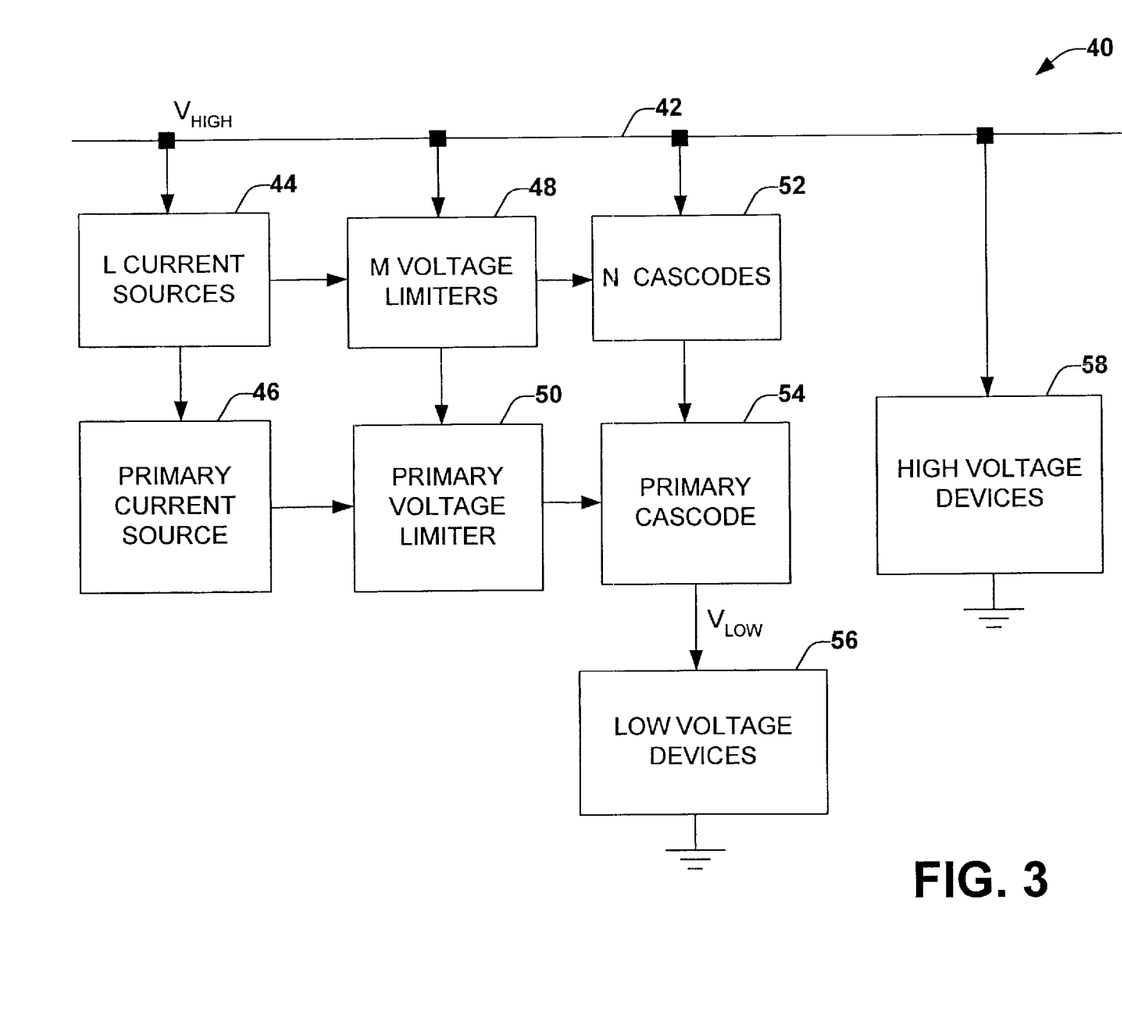
FIG. 3 illustrates a block diagram of a voltage limiting system that employs a plurality of voltage clamps in accordance with an aspect of the present invention.

The present invention relates to systems and methods for limiting voltage to circuitry fed from a high voltage supply. The invention can be best understood by reference to certain examples, such as the examples illustrated in FIGS. 3–7. FIG. 3 illustrates a voltage limiting system 40 in accordance with an aspect of the present invention. The voltage limiting system 40 employs a high-voltage supply to provide voltage to one or more low-voltage devices 56. The high-voltage supply provides a high voltage $V_{HIGH}$ (e.g., 100–400 volts) to the system 40 through a high-voltage bus 42. The high voltage $V_{HIGH}$ is employed to directly provide voltage to one or more high-voltage devices 58 and to indirectly provide voltage to the one or more low-voltage devices 56. A primary cascode device 54 (e.g., a MOSFET or a bipolar junction transistor) is coupled to the one or more low-voltage devices 56 to provide a low voltage $V_{LOW}$ (e.g., 3–15 volts) below the maximum voltage rating of the one or more low-voltage devices 56. A primary voltage limiter 50 (e.g., a plurality of Zener diodes connected in series) is coupled to the primary cascode device 54, so as to limit the voltage $V_{LOW}$. A primary current source 46 (e.g., a depletion MOSFET or a JFET) is coupled to the primary voltage limiter 50 to provide current necessary for its operation. The primary cascode device 54, the primary voltage limiter 52 and the primary current source 46 cooperate to assure that the voltage $V_{LOW}$ does not exceed the maximum voltage rating of the one or more low voltage devices 56.

The primary cascode device 54 also has a maximum voltage rating. Therefore, N additional cascodes 52 are coupled between the high-voltage bus 42 and the primary cascode 54 where N is an integer greater than or equal to one. The N additional cascodes employ M voltage limiters 48 connected in series with one another and with primary voltage limiter 50 where M is an integer greater than equal to one. Each of the M voltage limiters 48 is coupled to a respective member of the N cascodes 52. L current sources 44 provide bias currents to the M voltage limiters 48 where L is an integer greater than equal to one. It is to be appreciated that in some applications at least one of N, M and L can be equal.

In one aspect of the invention, the primary current limiter 46 and the L current sources 44 are constructed using nonlinear dissipative elements such as depletion MOSFET transistors or JFET transistors, configured to conduct essentially constant currents when biased by significant differential voltages. The primary current source 46 and the L current sources 44 are connected in series, and are constructed to provide the same amount of current ($I_{MIN}$) when biased by differential voltages. The series-connected current sources provide a path where current can flow from the bus 42 to the primary voltage limiter 50 and the M voltage limiters 48. The precise path taken by current from $V_{HIGH}$ to ground depends upon manufacturing variations in the L current sources 44 and the primary current source 46, and so is not deterministic, at least not prior to actual manufacture of the circuit. However, providing that $V_{HIGH}$ does not exceed the sum of the voltage ratings of the M voltage limiters 48 plus the voltage rating of the primary voltage limiter 50, the sum of all currents drawn by elements 44, 46, 48 and 50 will not exceed $I_{MIN}$.

Figure 4:
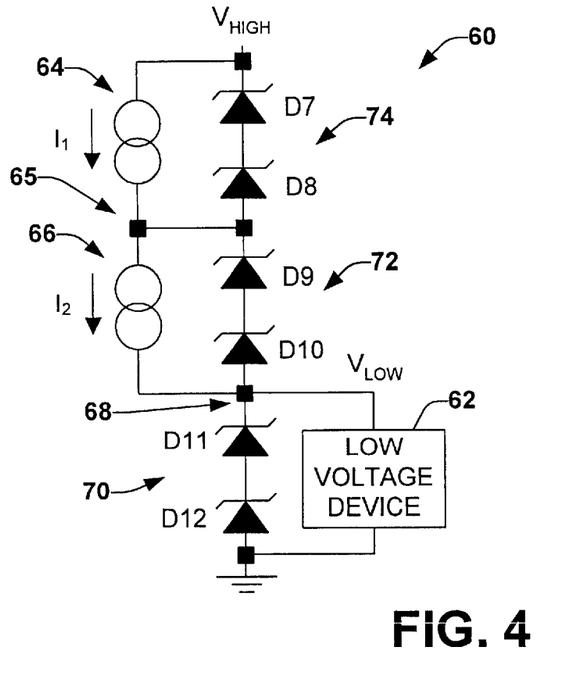
FIG. 4 illustrates a schematic block diagram of a voltage limiting circuit that employs a plurality of voltage clamps in accordance with an aspect of the present invention.

FIG. 4 illustrates a voltage limiting circuit 60 employing a plurality of Zener clamps in accordance with an aspect of the present invention. The voltage limiting circuit 60 provides a low voltage $V_{LOW}$ to a low-voltage device 62 employing a high-voltage supply $V_{HIGH}$. A primary Zener clamp 70 comprised of Zener diodes D11 and D12 is coupled in parallel with the low-voltage device 62. The Zener diodes D11 and D12 are operative to clamp the supply voltage to the low-voltage device 62 at $V_{LOW}$ once the voltage at node 68 reaches the sum of the breakdown voltages of the Zener diodes D11 and D12. A current source 66 (e.g., a depletion FET or a JFET) provides a current $I_2$ to bias the primary Zener clamp 70. A second Zener clamp 72 is comprised of a Zener diode D9 and a Zener diode D10. The second Zener clamp 72 is connected above the primary Zener clamp 70 and in parallel with the current source 66. A third Zener clamp 74 is comprised of a Zener diode D7 and a Zener diode D8. The third Zener clamp 74 is connected above the second Zener clamp 72 and in parallel with a current source 64. The current source 64 injects a current $I_1$ into a node 65. The current sources 64 and 66 are understood to be nonlinear passive elements, and therefore the nodes 68 and 65 cannot rise above $V_{HIGH}$. At low voltages, current flows through current source 64, then through current source 66, to reach node 68. Therefore, the node 68 rises to approximately equal to $V_{HIGH}$. As $V_{HIGH}$ rises, the voltage at node 68 will eventually reach the clamp voltage of the Zener clamp 70.

At this point, the current flow from $V_{HIGH}$ is limited by either current source 64 or current source 66, whichever provides less current. As $V_{HIGH}$ is raised yet higher, a voltage differential will appear across the current source which provides the lesser of the two currents. Eventually, this voltage will exceed the clamp voltage of the associated Zener clamp. At this point, current flow through the system will be limited by the current source which provides the greater of the two currents, and the voltage differential across its associated Zener clamp will begin rising. This voltage differential should not be allowed to exceed the clamp voltage, or large (and potentially destructive) currents will flow. To clarify the operation of the circuit, suppose that $I_2$ is larger than $I_1$. Once $V_{HIGH}$ exceeds the clamp voltage of Zener clamp 70, current through the circuit will be limited to $I_1$ by current source 64. As the voltage rises further, a voltage differential will appear across Zener clamp 74. Once this differential voltage reaches the clamp voltage of Zener clamp 74, a current $I_2-I_1$ will begin flowing through Zener clamp 74, and the current drawn by the circuit will be limited to $I_2$ by the current source 66.

In the circuit 60 of FIG. 4, the current $I_1$ and $I_2$ from the current sources 64 and 66, respectively, are designed to be substantially equal. In practice, slight manufacturing variations will ensure that one of the two current sources will be larger than the other. The operation of the circuit will therefore follow the description given above. It does not matter which of the two current sources is the larger, at least insofar as the low voltage device 62 is concerned. Small leakage currents will not affect the operation of the circuit, as it will continue to operate properly regardless of which of the two current sources is larger, and indeed, it will operate properly if they are precisely equal. The Zener clamps do not require significant current to operate, as their sole function is to clamp the maximum voltage seen across the respective current sources. This function will automatically be fulfilled whenever the voltage across the clamp exceeds the breakdown voltage of the Zeners comprising the clamp, regardless of what bias current is provided to the clamp by the associated current sources. Therefore, the current sources 64 and 66 can both be set to substantially the same value, a value selected to be larger than the maximum anticipated leakage current within the circuit, but otherwise selected to be as small as possible.

It is to be appreciated that the number of Zener clamps necessary to provide the voltage $V_{LOW}$ will be based on the voltage $V_{HIGH}$ of the high-voltage supply. The sum of the clamp voltages of all of the Zener clamps cannot be less than the maximum expected value of voltage $V_{HIGH}$. Although the Zener clamps of FIG. 4 are illustrated with two serially connected Zener diodes, they can be comprised of any number of serially connected Zener diodes, so as to generate a clamp voltage optimized for a given application. This clamp voltage should not exceed the maximum operating voltage of the associated current source, since the entire purpose of the Zener clamp is to protect the associated current source against overvoltage breakdown. It is also to be appreciated that, although the voltage clamps shown in FIG. 4 are comprised of Zener diodes, they could equally well be built with other circuitry that mimics the voltage-current characteristics of a Zener diode.

Figure 5:
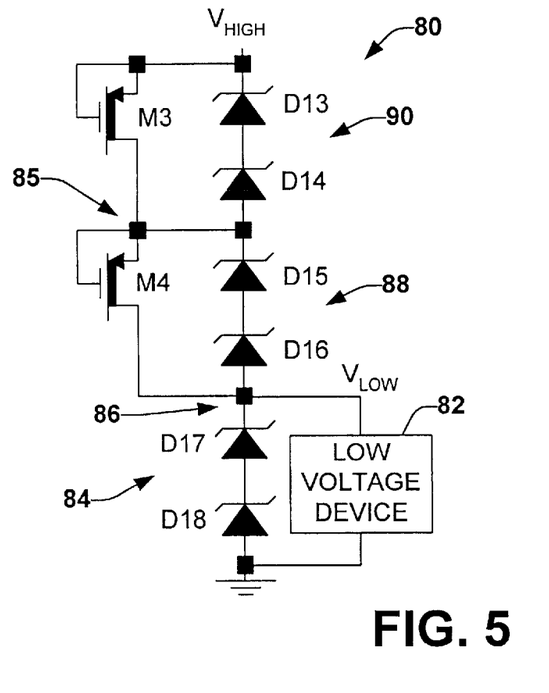
FIG. 5 illustrates a schematic block diagram of a circuit that employs Zener diodes that are nondeterministically biased using depletion PMOS transistors as current sources in accordance with an aspect of the present invention.

FIG. 5 illustrates a circuit 80 employing nondeterministically biased Zener clamps stacks that uses depletion PMOS transistors as current sources in accordance with an aspect of the present invention. A low voltage $V_{LOW}$ is provided to a low-voltage device 82 employing a high-voltage supply $V_{HIGH}$. A primary Zener clamp 84 comprised of Zener diodes D17 and D18 is coupled in parallel with the low-voltage device 82. The Zener diodes D17 and D18 are operative to clamp the supply voltage to the low-voltage device 82 at $V_{LOW}$ once the voltage at a node 86 reaches the sum of the breakdown voltages of the Zener diodes D17 and D18. A first depletion PMOS transistor M4 injects a current into node 86 to bias the primary Zener clamp 84. A second Zener clamp 88 comprised of Zener diodes D15 and D16 is connected above the primary Zener clamp 84 and in parallel with the first depletion PMOS transistor M4, while a third Zener clamp 90 comprised of Zener diodes D13 and D14 is connected above the second Zener clamp 88 and in parallel with a second depletion PMOS transistor M3. M3 injects a second bias current into a node 85.

The circuit 80 is a useful circuit element in its own right, as it can serve as a current source for circuits operating at voltages above the $V_{DS(MAX)}$ of the depletion FETs M3 and M4. The circuit 80 is particularly valuable when used in conjunction with dielectric-isolated (DI) processes, as very large voltages can be sustained across the isolation, allowing the stack to float at potentials of hundreds of volts even if any given device in the stack can only handle a small fraction of this voltage. Furthermore, DI exhibits negligible isolation leakage, and therefore the minimum current required to bias the stack becomes essentially independent of the number of devices in the stack. This ensures that all current sources in the stack can be set equal to $I_{MIN}$.

Figure 6:
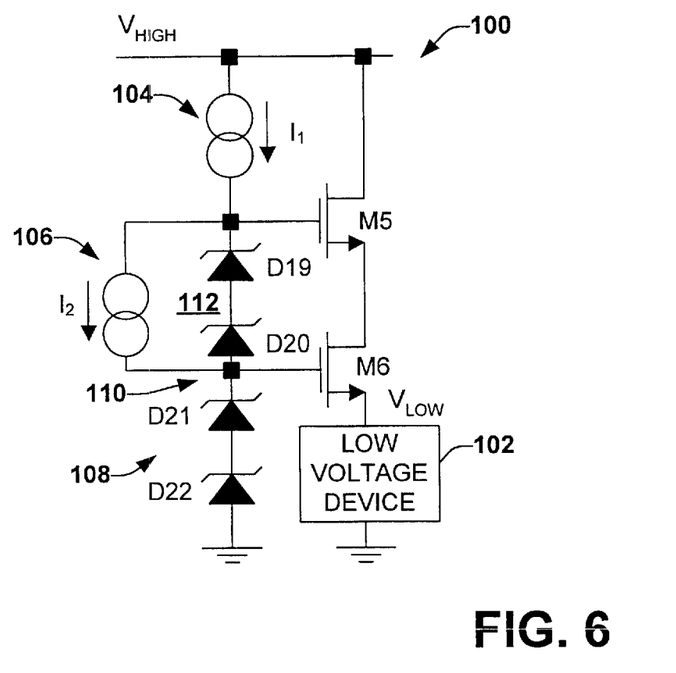
FIG. 6 illustrates a schematic block diagram of a voltage limiting circuit that employs a compliance stack to limit voltage to a low-voltage device in accordance with an aspect of the present invention.

FIG. 6 illustrates a voltage limiting circuit 100 that employs a compliance stack to provide a low voltage $V_{LOW}$ to a low-voltage device 102 employing a high-voltage supply $V_{HIGH}$ in accordance with an aspect of the present invention. The low-voltage device 102 is protected by a primary cascode transistor M6. A controlling terminal (e.g., gate of a MOSFET or base of a bipolar junction transistor) of M6 is connected to a primary Zener clamp 108 comprised of Zener diodes D21 and D22 coupled in parallel with the primary cascode transistor M6. The Zener diodes D21 and D22 clamp the voltage at node 110 applied to the gate of the primary cascode M6 to the sum of the breakdown voltages of the Zener diodes D21 and D22. A first current source 106 provides a current $I_2$ to bias the primary Zener clamp 108. If the breakdown voltage of a Zener diode (such as D21 or D22) equals $V_Z$, then the voltage $V_{LOW}$ equals:

$$V_{LOW} = 2V_Z - V_{GS6} \qquad \text{EQ. 6}$$

A second cascode device M5 is coupled between the high-voltage $V_{HIGH}$ and the primary cascode transistor M6. A controlling terminal (e.g., gate of a MOSFET or base of a bipolar junction transistor) M5 is connected to a second Zener clamp 112 comprised of Zener diodes D19 and D20, which is in turn are biased by a current source 104 generating a current $I_1$. The currents $I_1$ and $I_2$ generated by current sources 104 and 106 are set to be substantially equal to one another, so that the order in which Zener clamps 108 and 112 are biased is essentially nondeterministic. Higher voltages can be handled by recursively iterating the nondeterministic clamping schemes illustrated in FIGS. 4–5 (e.g., a cascode, Zener clamp and current source configured in a parallel arrangement).

Figure 7:
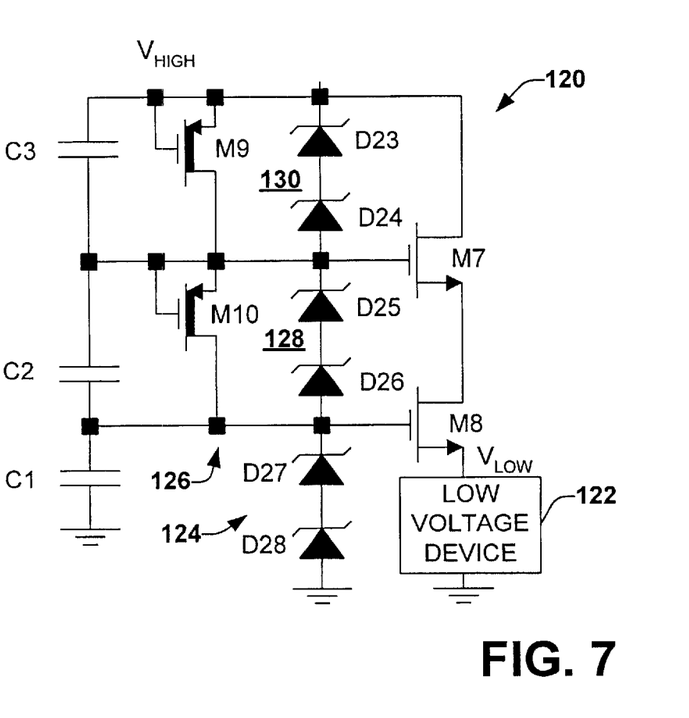
FIG. 7 illustrates a schematic block diagram of a voltage limiting circuit employing a low-current compliance stack in accordance with an aspect of the present invention.

FIG. 7 illustrates a voltage limiting circuit employing a low-current compliance stack in accordance with an aspect of the present invention. A low voltage $V_{LOW}$ is provided to a low-voltage device 122 employing a high-voltage supply $V_{HIGH}$. The low-voltage device 122 is protected by a primary cascode transistor M8. A controlling terminal (e.g., gate of a MOSFET or base of a bipolar junction transistor) of M8 is connected to a primary Zener clamp 124 comprised of Zener diodes D27 and D28 coupled in parallel with the primary cascode transistor M8. The Zener diodes D27 and D28 clamp the voltage at the node 126 applied to the gate of the primary cascode M8 to the sum of the breakdown voltages of the Zener diodes D27 and D28. A first depletion PMOS transistor M10 provides a current to bias the primary Zener clamp 124.

A second cascode device M7 is coupled between the high-voltage $V_{HIGH}$ and the primary cascode transistor M8. A controlling terminal (e.g., gate of a MOSFET or base of a bipolar junction transistor) of M7 is connected to a second Zener clamp 128 comprised of Zener diodes D25 and D26. A third Zener clamp 130 comprised of Zener diodes D23 and D24 is stacked above the second Zener clamp 128 and in parallel with a second depletion PMOS transistor M9. The second depletion PMOS transistor M9 provides a second bias current that cooperates with the first bias current to provide bias currents to Zener clamps 128 and 124. In one aspect of the invention, first depletion PMOS transistor M9 and the second depletion PMOS transistor M10 are set to a minimum current required to bias a Zener clamp. Manufacturing variations will determine the biasing order of the Zener clamps, rendering these nondeterministic, at least from the point of view of the circuit designer.

A capacitor C1 is coupled in parallel with the first Zener clamp, a second capacitor C2 is coupled in parallel with the second Zener clamp and a third capacitor C3 is coupled in parallel with the third Zener clamp. The capacitors C1, C2 and C3 facilitate equalizing voltage stresses across the components during rapid voltage excursions on high-voltage supply $V_{HIGH}$, such as those generated by electrostatic discharge (ESD), particularly the extremely rapid transients associated with machine discharges, such as are emulated by the charged device model (CDM). These capacitors need only be a few times the parasitic capacitance of the components they bypass, or perhaps 1 pF each for a practical circuit.

Figure 8:
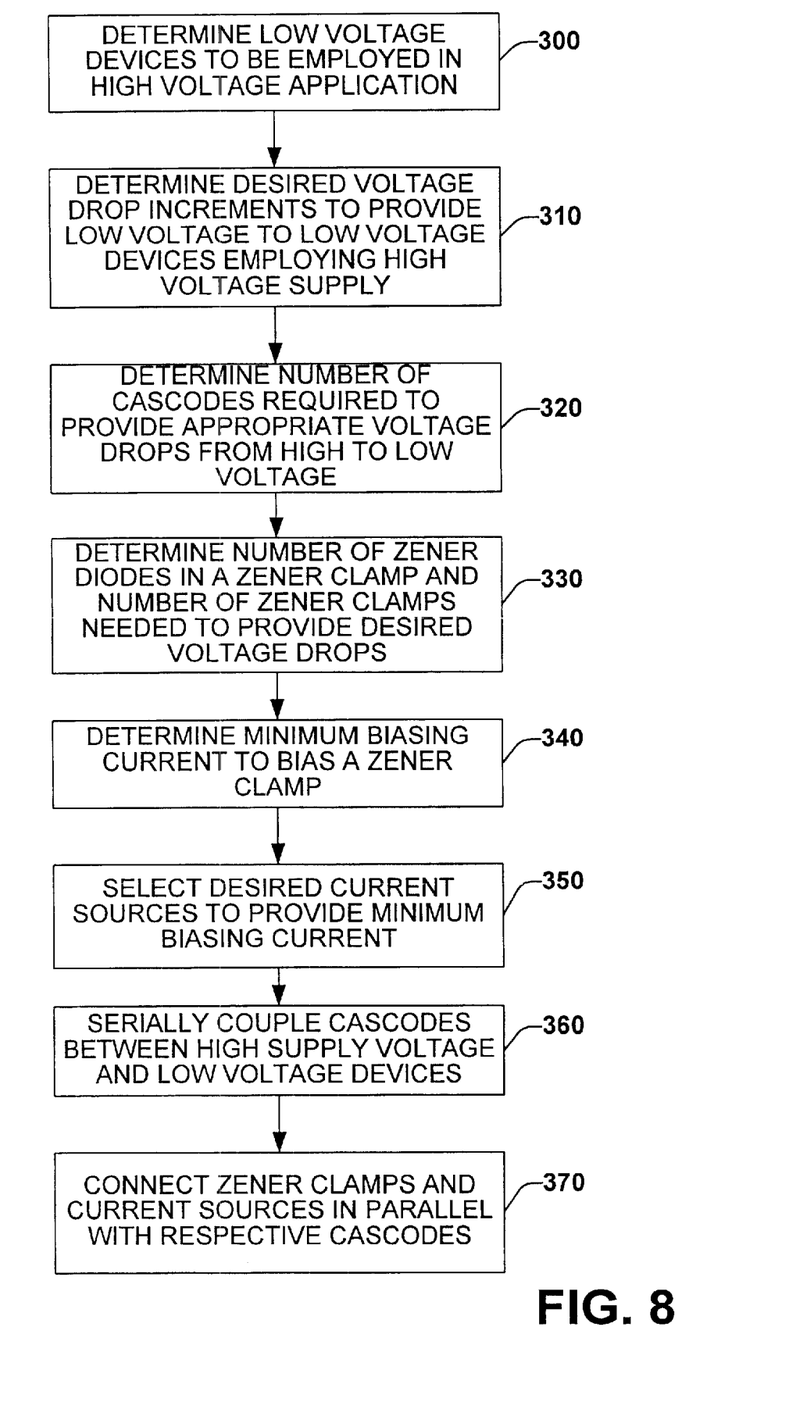
FIG. 8 illustrates a flow diagram of a methodology for providing a device that limits voltage to low-voltage devices in high-voltage applications in accordance with an aspect of the present invention.

In view of the foregoing structural and functional features described above, methodologies in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates one particular methodology for providing a device that limits voltage to low-voltage devices in high-voltage applications in accordance with an aspect of the present invention. The methodology begins at 300 where the low-voltage devices to be employed in the high-voltage application are determined. At 310, the desired voltage drop increments are determined to provide the low voltage to the low-voltage devices employing the high voltage supply. These increments should be within the voltage ratings of available transistors suitable for use as cascodes. At 320, the number of cascodes required are determined, based on the number of voltage increments required to span the difference between the high supply voltage and the operating voltage of the low-voltage devices. The methodology then proceeds to 330.

At 330, the number of Zener diodes in a Zener clamp is determined by dividing the magnitude of the voltage drop increment determined in step 310 by the breakdown voltage of the available Zener diodes. At 340, the minimum biasing current to bias a Zener clamp is determined, for example, by an analysis of expected leakage currents from the Zener diodes contained within a Zener clamp. At 350, current sources are selected to provide the minimum biasing current. The current sources can be, for example, depletion FETs or JFETs. At 360, the cascodes are serially coupled between the high supply voltage and the low voltage devices. The methodology then advances to 370. At 370, the Zener clamps are coupled in parallel with the respective cascodes and a primary Zener clamp is coupled in parallel with a primary cascode. The lower-voltage end of the primary Zener clamp returns to a circuit common node (ground), and the source (or emitter) of the primary cascode transistor connects to the low-voltage devices. Current sources are then coupled in parallel with the respective cascodes, except that no current source is coupled in parallel with the primary cascode. Capacitors can be provided in parallel with each Zener clamp to protect against voltage transients.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for limiting voltage to low-voltage devices employing a high-voltage supply, the system comprising:

a first cascode device coupled to at least one low-voltage device;

a first voltage limiter coupled to bias the first cascode device, so that the first cascode device provides a low voltage to the at least one low-voltage device;

a second cascode device serially coupled between the first cascode device and the high-voltage supply;

a second voltage limiter serially coupled to the first voltage limiter and coupled to the second cascode device;

a third voltage limiter serially coupled between the second voltage limiter and the high-voltage supply;

a first current source coupled in parallel with the second voltage limiter; and a second current source coupled in parallel with the third voltage limiter, the currents of the first and the second current sources being substantially equal.

2. The system of claim 1, the first current source and the second current source being one of a JFET and a depletion MOSFET.

3. The system of claim 1, the first voltage limiter, the second voltage limiter and the third voltage limiter being Zener clamps, each Zener clamp comprising a plurality of serially connected Zener diodes.

4. The system of claim 1, further comprising a plurality of cascode devices serially coupled between the second cascode device and the high-voltage supply, a plurality of voltage limiters serially coupled between the third voltage limiter and the high-voltage supply and coupled to the plurality of cascode devices, and a plurality of current sources coupled in parallel with the plurality of voltage limiters, wherein the currents provided by the plurality of current sources are substantially equal to one another and to the currents provided by the first and second current sources.

5. The system of claim 1, the first cascode device and the second cascode device being MOSFET transistors, the first voltage limiter being coupled from a gate of the first cascode device to ground and the second voltage limiter being coupled between the gate of the first cascode device and a gate of the second cascode device.

6. The system of claim 1, the first cascode device and the second cascode device being bipolar transistors, the first voltage limiter being coupled from a base of the first cascode device to ground and the second voltage limiter being coupled between the base of the first cascode device and a base of the second cascode device.

7. The system of claim 1, further comprising a plurality of capacitors coupled across the first voltage limiter, the second voltage limiter, and the third voltage limiter.

8. An integrated circuit comprising the system of claim 1.

9. A circuit for limiting voltage to low-voltage devices employing a high-voltage supply, the circuit comprising:

a first cascode transistor coupled to at least one low-voltage device;

a first Zener clamp consisting of a first plurality of serially connected Zener diodes coupled to a controlling terminal of the first cascode transistor;

a second cascode transistor coupled between the first cascode transistor and the high-voltage supply;

a second Zener clamp consisting of a second plurality of serially connected Zener diodes coupled between the controlling terminal of the first cascode transistor and a controlling terminal of the second cascode transistor;

a third Zener clamp that couples the second Zener clamp to the high-voltage supply;

a first current source coupled in parallel with the second Zener clamp; and a second current source coupled in parallel with the third Zener clamp, the currents of the first and the second current sources being substantially equal.

10. The circuit of claim 9, the first cascode transistor and the second cascode transistor being MOSFET transistors whose controlling terminals are gates.

11. The circuit of claim 9, the first cascode transistor and the second cascode transistor being bipolar transistors whose controlling terminals are bases.

12. The circuit of claim 9, the first current source and the second current source being one of a JFET and a depletion MOSFET.

13. The circuit of claim 9, further comprising a plurality of cascode transistors serially coupled between the second cascode transistor and the high-voltage supply, a plurality of Zener clamps serially coupled between the third Zener clamp and the high-voltage supply, and a plurality of current sources coupled in parallel with the plurality of Zener clamps, wherein the currents provided by the plurality of current sources are substantially equal to one another and to the currents provided by the first and second current sources.

14. The circuit of claim 9, further comprising a first capacitor coupled in parallel with the first Zener clamp, a second capacitor coupled in parallel with the second Zener clamp and a third capacitor coupled in parallel with the third Zener clamp.

15. An integrated circuit comprising the circuit of claim 9.

16. A method for providing a device that limits voltage to low-voltage devices in high-voltage applications, the method comprising:

determining a number of cascode devices to provide a desired voltage drop between a high-voltage supply and at least one low-voltage device;

determining a number of Zener clamps to bias the cascode devices;

determining a minimum current required to bias a Zener clamp; and determining a number of current sources required to bias the Zener clamps.

17. The method of claim 16, further comprising:

serially coupling the number of cascode devices between the high-voltage supply and the at least one low-voltage device with a first cascode being coupled to the low-voltage device;

coupling a corresponding Zener clamp in parallel with an associated cascode device with a first Zener clamp being coupled to the first cascode device;

providing current sources that provide currents substantially equal to the minimum current; and coupling an associated current source in parallel with an associated Zener clamp, such that the current source coupled in parallel with the Zener clamp above the first Zener clamp provides a bias current to the first Zener clamp, so that the low voltage provided to the at least one low-voltage device does not exceed the voltage parameter limits of the at least one low-voltage device.

18. The method of claim 17, in which the first Zener clamp biases first and the remaining Zener clamps bias in a nondeterministic order.

19. The method of claim 17, further comprising coupling capacitors in parallel with the Zener clamps to mitigate voltage transients experienced by the device.

20. The method of claim 17, further comprising fabricating the device that limits voltage to low-voltage devices in high-voltage applications on an integrated circuit.

* * * * *